United States Patent
Kobayashi et al.

(10) Patent No.: US 6,469,338 B2
(45) Date of Patent: Oct. 22, 2002

(54) NON-VOLATILE SEMICONDUCTOR MEMORY DEVICE AND MANUFACTURING METHOD THEREOF

(75) Inventors: Kiyoteru Kobayashi; Naoki Tsuji, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/324,808

(22) Filed: Jun. 3, 1999

(65) Prior Publication Data

US 2002/0005561 A1 Jan. 17, 2002

(30) Foreign Application Priority Data

Dec. 9, 1998 (JP) ............................................ 10-349833

(51) Int. Cl.[7] .............................................. H01L 29/94
(52) U.S. Cl. ...................................... 257/315; 257/506
(58) Field of Search ................................ 257/315, 314, 257/316, 319, 506, 509

(56) References Cited

U.S. PATENT DOCUMENTS 5,994,733 A * 11/1999 Nishioka et al. ............ 257/316
6,324,101 B1 * 11/2001 Miyawaki .............. 365/185.28

FOREIGN PATENT DOCUMENTS

| JP | 60-10655 | 1/1985 |
|---|---|---|
| JP | 61-56446 | 3/1986 |
| JP | 61-114548 | 6/1986 |
| JP | 63-228710 | 3/1988 |
| JP | 5-55493 | 3/1993 |
| JP | 5-198543 | 8/1993 |
| JP | 8-107158 | 4/1996 |

OTHER PUBLICATIONS

"Dislocation Generation due to Stress Induced by Oxidation in Si Grooves", Y. Takano et al., Japanese Journal of Applied Physics, vol. 22(1983), pp. 553–556.

"High Density Contactless, Self Aligned Eprom Cell Array Technology", J. Esquivel et al., IEDM 86, pp. 592–595.

* cited by examiner

Primary Examiner—Olik Chaudhuri
Assistant Examiner—Ginette Peralta
(74) Attorney, Agent, or Firm—McDermott, Will & Emery

(57) ABSTRACT

A non-volatile semiconductor memory device allowing accurate reading of data, having superior charge detection characteristic and high rewriting durability, and free of undesirable writing of a non-selected memory cell transistor is provided. A memory cell transistor 100b includes a silicon substrate 1 having a main surface, a plurality of strip shaped isolating oxide films 4a and 4b formed on the main surface 1b of silicon substrate 1 to continuously extend approximately along the <100> direction, and strip shaped source and drain regions 5b and 6b formed on the main surface 1b of silicon substrate 1 to continuously extend approximately along the <100> direction.

2 Claims, 16 Drawing Sheets

NON-VOLATILE SEMICONDUCTOR MEMORY DEVICE AND MANUFACTURING METHOD THEREOF

BACKGROUND OF THE INVENTION

1. Field of the Invention

The present invention relates to a non-volatile semiconductor memory device and manufacturing method thereof. More specifically, the present invention relates to a structure of an EEPROM (Electrically Erasable and Programmable Read Only Memory) and manufacturing method thereof.

2. Description of the Background Art

Conventionally, an EEPROM which allows programming of data freely and allows electrical writing and erasing of information has been known as one of the non-volatile semiconductor memory devices. The EEPROM has a source region, a drain region and a control gate electrode. These are arranged in various manners. An EEROM has been known in which an impurity region extending in one direction provided at the surface of a semiconductor substrate is used as the source and drain regions for miniaturization.

The structure of such an EEPROM will be described in the following.

FIG. 29 is a cross section of the EEPROM described in Japanese Patent Laying-Open No. 8-107158. Referring to FIG. 29, a memory cell transistor 500 constituting the EEPROM includes an Si substrate 511, a source region 515a, a drain region 515b, polycrystalline Si films 521a, 521b and a silicide film 526b as the floating gate electrode, and a polycrystalline Si film 523 as a control gate electrode.

Source and drain regions 515a and 515b formed in Si substrate 511 are formed to extend from this side to the depth side of the sheet. Control gate electrode 523 extends from the right to the left direction of FIG. 29, that is, in the direction crossing the direction of extension of the source and drain regions 515a and 515b.

An $SiO_2$ film 514 in a pattern of element isolating region is formed on Si substrate 511. An $SiO_2$ film 517 as a gate oxide film is formed on the surface of Si substrate 511. Polycrystalline Si film 521a constituting the floating gate electrode is formed on $SiO_2$ film 517. Silicide film 526b is formed on polycrystalline Si film 521a.

Silicide film 526a is formed on the surfaces of source and drain regions 515a and 515b.

An $SiO_2$ film 525 is formed on a sidewall of polycrystalline Si film 521a. On Si substrate 511, an interlayer insulating film 527 is formed. Polycrystalline Si film 521b constituting the floating gate electrode is formed on interlayer insulating film 527. An ONO film 522 including a stack of an oxide film, a nitride film and an oxide film is formed on polycrystalline Si film 521b. Polycrystalline Si film 523 as the control gate electrode is formed on ONO film 522.

In such an EEPROM, source and drain regions 515a and 515b are formed by impurity regions extending in one direction at the surface of Si substrate 511. Therefore, the number of interconnection layers can be reduced as compared with such EEPROMs in which the source and drain regions are formed in the shape of islands which are connected by interconnection layers. Therefore, the EEPROM of the above described type is suitable for miniaturization. IEDM86, pp. 592 to 595 describes an EPROM (Electrically Programmable Read Only Memory) in which impurity regions extending in one direction are used as source and drain regions.

In such an EEPROM as shown in FIG. 29, presence/absence of information (data) is determined dependent on whether electrons are stored or not in the floating gate electrode constituted by polycrystalline Si film 521a, 521b and silicide film 526b.

When electrons are injected in the floating gate electrode, the threshold voltage of memory cell transistor 500 assumes a high value of Vthp. This state is referred to as a programmed state. In this state, data "0" is stored in memory cell transistor 500.

The electrons accumulated in the floating gate electrode do not dissipate but are kept semi-permanently, and therefore the stored data is held semi-permanently.

When electrons are not accumulated in the floating gate electrode, the threshold value of memory cell transistor 500 attains to a low value of Vthe. This state is referred to as an erased state. In this state, data "1" is stored in memory cell transistor 500. By detecting these two states, data stored in memory cell transistor 500 can be read.

The operation of memory cell transistor 500 shown in FIG. 29 will be described.

At the time of programming, a positive high voltage Vpp (typically about 20V) is applied to control gate electrode 523. Si substrate 511, source region 515a and drain region 515b are set to the ground potential. Accordingly, electrons gather in the channel region formed between the source and drain regions 515a and 515b, which electrons are injected to the floating gate electrode by tunneling phenomenon. As a result, the threshold voltage of memory cell transistor 500 attains higher to Vthp.

Among memory cell transistors not selected at the time of programming, in that one which shares control gate electrode 523 with memory cell transistor 500, a high voltage of about 20V is applied to control gate electrode 523, a voltage of about 7 volt is applied to the drain region, the source region is set to the floating state and the substrate is set to the ground potential.

At the time of erasure, a negative high voltage Vpp (typically about −20V) is applied to control gate electrode 523, and source region 515a, drain region 515b and Si substrate 512 are set to the ground potential. Accordingly, the electrons which have been stored in the floating gate electrode are discharging by the tunneling phenomenon to Si substrate 511. As a result, the threshold voltage of memory cell transistor 500 lowers to Vthe.

In a reading operation of selected memory cell transistor 500, assuming that Vthe<3.3V<Vthp, 3.3V is applied to control gate electrode 523 and drain region 515b. Source region 515a and Si substrate 511 are set to the ground potential.

The threshold voltage Vthp in the programmed state is higher than 3.3V, and therefore in the programmed state, no current flows between the source and drain regions 515a and 515b. As the threshold voltage Vthp in the erased state is smaller than 3.3V, current flows between source and drain regions 515a and 515b in the erased state.

At the time of reading, in the non-selected memory cell transistor, the control gate electrode is set to the ground potential, 3.3V is applied to the drain region, and the source region and the Si substrate are set to the ground potential. At this time, since the threshold voltages Vthp and Vthe are generally larger than 0V, no current flows between the source and drain regions of the memory cell transistor if the voltage applied to the control gate electrode is 0V.

In the above described memory cell transistor, during the process of heating for forming $SiO_2$ film 514 on Si substrate 511, $SiO_2$ film 514 tends to extend in the direction of the longer side. Thereafter, $SiO_2$ film 514 is cooled and tends to contract in the longer side direction.

In the step of thermal diffusion for forming source and drain regions 515a and 515b, the source and drain regions 515a and 515b tend to extend in the direction of the longer side. Thereafter, the source and drain regions 515a and 515b tend to contract in the direction of the longer side. This causes tensile or compressive stress to Si substrate 511. Accordingly, crystal defect results in the channel region between the source and drain regions 515a and 515b. A crystal defect tends to occur when stress remains in the <110> direction. Since arsenic which is implanted in the source or drain region 515a or 515b is trapped in the crystal defect, the distance (channel length) between the source and drain regions 515a and 515b is made shorter. When such a memory cell transistor is selected and the voltage of 3.3V is applied to the drain region 515b, a current always flows because of punch through between the source and drain regions 515a and 515b, regardless of the threshold voltage of the memory cell transistor. Therefore, even if the memory cell transistor is in the programmed state, current flows between the source and drain regions 515a and 515b, resulting in erroneous detection of information.

When a crystal defect exists in the channel region, $SiO_2$ film 517 as the gate oxide film formed on the channel region is also prone to crystal defects. When there is a crystal defect in $SiO_2$ film 517, $SiO_2$ film 517 experiences dielectric breakdown when electrons are discharged from the floating gate electrode to Si substrate 511 through $SiO_2$ film 517, or when electrons are injected from Si substrate 511 to the floating gate electrode through $SiO_2$ film 517. This leads to a problem of shorter life of rewriting. Further, there is also a problem that the charges which have been accumulated in the floating gate electrode leak through $SiO_2$ film 517 to Si substrate 511, so that charges cannot be retained.

Further, in the transistor not selected at the time of programming and sharing control gate electrode 523 with the selected memory cell transistor, a high voltage of about 20V is applied to control gate electrode 523, a voltage of about 7V is applied to the drain region, the source region is set to the floating state and Si substrate is set to the ground potential.

At this time, as Si substrate 511 is of p type and drain region 511b is of n type, the p-n junction at the interface between Si substrate 511 and drain region 515b is biased in reverse direction. Therefore, a depletion layer extends from the interface toward the Si substrate 511.

When there is a crystal defect in the channel region and the depletion layer extends to reach the crystal defect, electron-hole pairs generate from the crystal defect. The generated electrons are accelerated toward control gate electrode 523 to which the high voltage of about 20V is applied. The accelerated electrons passes through $SiO_2$ film 517 and injected in the floating gate electrode. This phenomenon is a writing to a non-selected memory cell transistor, which is generally referred to as "drain disturb".

When such a phenomenon occurs, a non-selected memory cell transistor is programmed, and therefore accurate writing of information becomes impossible.

SUMMARY OF THE INVENTION

The present invention was made to solve the above described problems, and its object is to provide a non-volatile semiconductor memory device allowing accurate reading of information, superior in life of rewriting and charge retention characteristic, and free of the so called drain disturb phenomenon, as well as to provide a manufacturing method of such a semiconductor memory device.

The non-volatile semiconductor memory device in accordance with the present invention includes a semiconductor substrate, a plurality of strip shaped isolating insulation films, a plurality of strip shaped impurity regions, a floating gate electrode and a control gate electrode.

The semiconductor substrate has a main surface. The plurality of strip shaped isolating insulation films are formed on the main surface of the semiconductor substrate extending continuously and approximately along the <100> direction. The plurality of strip shaped impurity regions are provided between the plurality of isolating insulation films, and formed on the main surface of the semiconductor substrate extending continuously and approximately along the <100> direction. The floating gate electrode is provided between the impurity regions, and formed on the main surface of the semiconductor substrate with a first dielectric film interposed. The control gate electrode is formed on the floating gate electrode with a second dielectric film interposed.

Here, the <100> direction represents a direction equivalent to [100], and more specifically, it includes [–100], [010], [0–10], [001] and [00–1] directions. Here, a negative number of Miller index is represented by "–1".

In the non-volatile semiconductor memory device structured as described above, both the impurity region and the isolating insulation film extend along the <100> direction. Accordingly, the impurity regions and the isolating insulation films tend to expand or contract along the <100> direction when heated/cooled during formation. Therefore, stress remains in the semiconductor substrate along the <100> direction. In the semiconductor substrate, the <100> direction is less susceptible to crystal defect such as dislocation even when there remains stress, as compared with other directions, for example, compared with the cleavage direction of <100>. Therefore, generation of crystal defect in the channel region formed between adjacent impurity regions is suppressed. This means that leakage current caused by punch through is not generated in the channel region. Accordingly, accurate reading of information is possible when the non-volatile semiconductor memory device is read.

Further, as there is no crystal defect in the channel region, there is no crystal defect generated in the first dielectric film formed on the channel region, either. Therefore, dielectric breakdown of the first dielectric film can be prevented when the electrons are injected from the semiconductor substrate to the floating gate through the first dielectric film or when the electrons are drawn out from the floating gate electrode to the semiconductor substrate through the first dielectric film. As a result, the life of rewriting is improved, and charge retention characteristic of the floating gate electrode is improved.

In a memory cell transistor not selected at the time of programming, a high voltage is applied to the control gate electrode, a low voltage is applied to the impurity region (drain region) and the semiconductor substrate is set to the ground potential. In this state, even when a depletion layer generates at the interface between impurity region and semiconductor substrate and the depletion layer extends to the channel region, electron-hole pairs do not generate in the channel region, as there is no crystal defect in the channel region. Therefore, even when a high voltage is applied to the control gate electrode, electrons are not passed through the first dielectric film to be injected to the floating gate electrode. Therefore, programming of the non-selected memory cell transistor is prevented. Namely, the so called drain disturb phenomenon can be prevented. It is not clearly disclosed or suggested in the aforementioned Japanese Patent Laying-Open No. 8-107158 and IEDM86, pp. 592 to 595 that in the non-volatile semiconductor memory devices described therein, the isolating oxide film and the impurity regions are formed along the <100> direction, and therefore the above described effects cannot be attained.

Preferably, the impurity region contains boron or arsenic. When the impurity region contains boron, the impurity region containing boron has smaller lattice constant than the semiconductor substrate, and therefore it tends to apply compressive stress to the semiconductor substrate. Further, the strip shaped isolating insulation films formed sandwiching the impurity regions apply tensile stress to the semiconductor substrate. Therefore, the compressive stress from the impurity region and the tensile stress from the isolating insulation film cancel each other. As a result, the semiconductor substrate is less susceptible to any stress, and hence generation of crystal defects can be prevented.

When the impurity region contains arsenic, the impurity region containing arsenic has approximately equal lattice constant as the semiconductor substrate, and therefore is does not cause any strain in the semiconductor substrate. Therefore, generation of crystal defects can be prevented.

Further, on the main surface of the semiconductor substrate, preferably, a plurality of trenches are formed extending continuously and approximately along the <100> direction, with each of the isolating insulation films filled in each of the trenches. As trenches are formed on the main surface of the semiconductor substrate and isolating insulation films are filled in the trenches as described above, the non-volatile semiconductor memory device can further be miniaturized.

Further, preferably, the semiconductor substrate is formed of a single crystal of an element having a diamond type structure.

Further, the semiconductor substrate preferably includes silicon.

The floating gate electrode preferably includes a plurality of floating gate electrodes formed spaced from each other approximately along the <100> direction.

Further, the isolating insulation films and the impurity regions preferably extend parallel to each other.

Preferably, the control gate electrode includes a plurality of control gate electrodes extending continuously along a certain direction, and the direction of extension of the isolating insulation films and the impurity regions is approximately orthogonal to the direction of extension of the control gate electrodes. This allows formation of many memory cell transistors in a small space, and the non-volatile semiconductor memory device can be miniaturized.

A non-volatile semiconductor memory device in accordance with another aspect of the present invention includes a semiconductor substrate, a plurality of strip shaped isolating insulation films, a plurality of strip shaped impurity regions, a floating gate electrode and a control gate electrode.

The semiconductor substrate has a main surface. The plurality of strip shaped isolating insulation films are formed on the main surface of the semiconductor substrate extending continuously approximately along the <100> direction. The plurality of strip shaped impurity regions are provided between the plurality of isolating insulation films, and formed on the main surface of semiconductor substrate extending parallel to the direction of extension of the plurality of isolating insulation films, the floating gate electrode is provided between the plurality of impurity regions, and formed on the main surface of the semiconductor substrate with a first dielectric film interposed. The control gate electrode is formed on the floating gate electrode with a second dielectric film interposed.

The floating gate electrode includes a plurality of floating gate electrodes formed spaced from each other, approximately along the <100> direction. The control gate electrode includes a plurality of control gate electrodes formed extending continuously along a certain direction. The direction of extension of the isolating insulation films and the impurity regions is approximately orthogonal to the direction of extension of the control gate electrodes.

In the non-volatile semiconductor memory device structured as described above, the impurity regions and the isolating insulation films both extend approximately along the <100> direction. Therefore, the impurity regions and the isolating insulation films tend to expand or contract along the <100> direction when heated/cooled during formation. Therefore, stress remains in the semiconductor substrate along the <100> direction. In the semiconductor substrate, the <100> direction is less susceptible to generation of crystal defects such as dislocation even when stress is applied, as compared with other directions, for example, the cleavage direction of <100>. Therefore generation of the crystal defect in the channel region formed between adjacent impurity regions can be suppressed. Therefore, leakage current caused by punch through in the channel region is suppressed, enabling accurate reading of information.

As there is no crystal defect in the channel region, there is no crystal defect generated in the first dielectric film formed on the channel region. Therefore, dielectric breakdown of the first dielectric film can be prevented when electrons are injected from the semiconductor substrate to the floating gate electrode through the first dielectric film or when the electrons are drawn out from the floating gate electrode to the semiconductor substrate through the first dielectric film. As a result, life of rewriting of the non-volatile semiconductor memory device is improved, and the charge retention characteristic is also improved.

Further, in a non-selected memory cell transistor at the time of programming, a high voltage is applied to the control gate electrode and a low voltage is applied to the impurity region (drain region) and the substrate is set to the ground potential. In this state, even when a depletion layer generates at the interface between the impurity region and the semiconductor substrate and the depletion layer extends to the channel region, electron-hole pairs do not generate in the channel region, as there is no crystal defect in the channel region. Therefore, even when a high voltage is applied to the control gate electrode, electrons are not passed through the first dielectric film to be injected to the floating gate electrode. Therefore, the so called drain disturb phenomenon at the time of programming can be prevented.

The method of manufacturing a non-volatile semiconductor memory device in accordance with the present invention includes the following steps.

(1) Forming a plurality of strip shaped isolating insulation films on a main surface of a semiconductor substrate to extend continuously and approximately along the <100> direction.

(2) Forming a plurality of strip shaped impurity regions between the plurality of the isolating insulation films on the main surface of the semiconductor substrate extending continuously and approximately along the <100> direction.

(3) Forming a plurality of strip shaped first conductive layers between the plurality of impurity regions to extend continuously and approximately along the <100> direction on the main surface of the semiconductor substrate, with a first dielectric film interposed.

(4) Forming a second conductive layer on the first conductive layer with a second dielectric film interposed.

(5) Etching the first and second conductive layers to form a floating gate electrode on the main surface of the semiconductor substrate with the first dielectric film interposed, and forming a control gate electrode on the floating gate electrode with the second dielectric film interposed.

In the method of manufacturing the non-volatile semiconductor memory device including the above described steps, in the step (3), the strip shaped impurity regions, the isolating insulation films and the first conductive layers are formed approximately along the <100> direction. Therefore, stress remains in the semiconductor substrate along the <100> direction by heating/cooling when these layers are formed. The <100> direction of the semiconductor substrate is less susceptible to generation of crystal defects such as dislocation as compared with other directions, for example, the cleavage direction of <110>. Therefore, generation of crystal defects in the channel region formed between adjacent impurity regions can be suppressed. Accordingly, leakage current caused by punch through in the channel region can be prevented, and therefore accurate reading of information is possible.

Further, as there is no crystal defect in the channel region, there is no crystal defect generated in the first dielectric film formed on the channel region. As a result, even when the non-volatile semiconductor memory device is used for a long period of time, the first dielectric film is free of dielectric breakdown, and therefore life of rewriting and charge retention characteristic are improved.

Further, as there is no crystal defect generated in the channel region, in the non-selected memory cell transistor at the time of programming, even when there is a reverse bias between the impurity region and semiconductor substrate and a depletion layer extends to the channel region, electron-hole pairs do not generate as there is no crystal defect in the channel region. Therefore, even when a high voltage is applied to the control gate electrode, electrons are not passed through the first dielectric film to be injected to the floating gate electrode. As a result, the so called drain disturb phenomenon can be prevented.

Preferably, the step of forming the control gate electrode includes the step of forming a plurality of strip shaped control gate electrodes to extend continuously in a direction approximately orthogonal to the direction of extension of the first conductive layers. Here, as the direction of the control gate electrodes is approximately orthogonal to the direction of extension of the first conductive layers, many control gate electrode can be formed in a small space. Therefore, the non-volatile semiconductor memory device can further be miniaturized.

Further, preferably, the step of forming the floating gate electrode includes the step of forming a plurality of floating gate electrode spaced from each other approximately along the <100> direction.

Further, the step of forming the plurality of isolating insulation films preferably includes forming a plurality of isolating insulation films using a semiconductor substrate having a notch indicating the <100> direction. As a substrate having a notch indicating the <100> direction is used, the semiconductor substrate can be positioned aligned with the <100> direction. Therefore, the non-volatile semiconductor memory device in accordance with the present invention can be manufactured utilizing the conventional apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
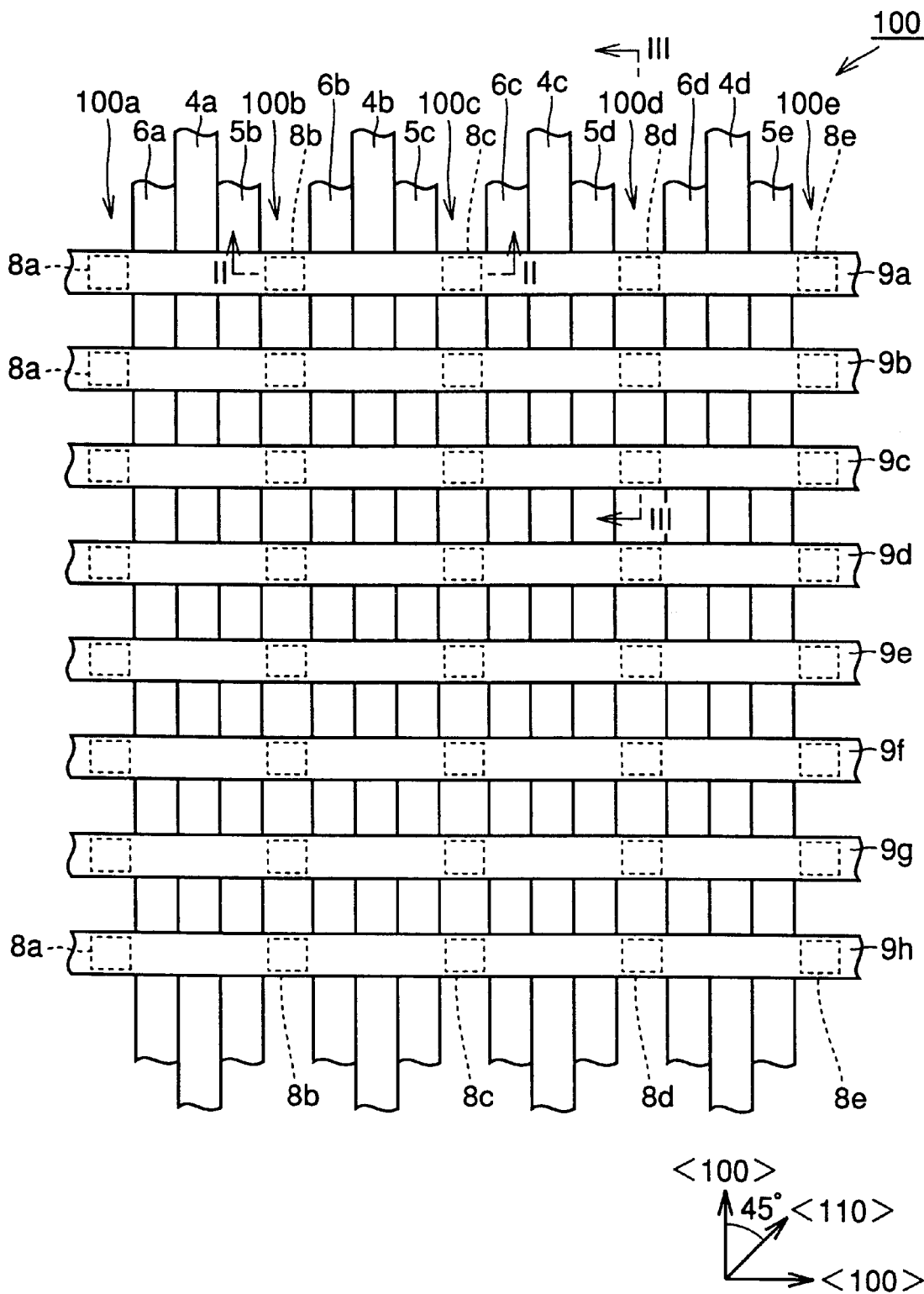
FIG. 1 is a plan view of the EEPROM in accordance with the present invention.

Embodiments of the present invention will be described with reference to the figures. Referring to FIG. 1, in an EEPROM 100 as a non-volatile semiconductor memory device in accordance with the present invention, a plurality of strip shaped isolating oxide films 4a, 4b, 4c and 4d are formed spaced from each other and extending approximately along the <100> direction, on a p type silicon substrate.

Between isolating oxide films 4a, 4b, 4c and 4d, strip shaped source regions 5b, 5c, 5d and 5e as well as strip shaped drain regions 6a, 6b, 6c and 6d are formed by diffusing arsenic, which is an n type impurity, to the silicon substrate, to extend parallel to the direction of extension of the isolating oxide films 4a, 4b, 4c and 4d. Between the source region 5b as an impurity region and the drain region 6b as an impurity region, floating gate electrodes 8b are formed spaced from each other as represented by dotted lines, dispersed along the direction of extension of the source and drain regions 5b and 6b. Further, floating gate electrodes 8a are formed spaced from each other between drain region 6a and a source region, not shown.

Similarly, between source region 5c and drain region 6c, floating gate electrodes 8c are formed, between source region 5d and drain region 6d, floating gate electrodes 8d are formed, and between source region 5e and a drain region, not shown, floating gate electrodes 8e are formed.

In a direction approximately orthogonal to the direction of extension of the source regions 5b, 5c, 5d and 5e, drain regions 6a, 6b, 6c and 6d and isolating oxide films 4a, 4b, 4c and 4d, that is, in the direction approximately along <100>, control gate electrodes 9a to 9h (word lines) are formed. Control gate electrode 9a to 9h are formed on the source and drain regions and the isolating oxide films. Therefore, though it seems as if the source and drain regions and the isolating oxide films are disconnected below control gate electrodes 9a to 9h in FIG. 1, actually, the source and drain regions and the isolating oxide films are continuous, below control gate electrodes 9a to 9h. Below the strip shaped control gate electrodes 9a to 9h, floating gate electrodes 8a to 8e are formed. At portions where floating gate electrodes 8a to 8e exist, memory cell transistors 100a to 100e are formed.

Figure 2:
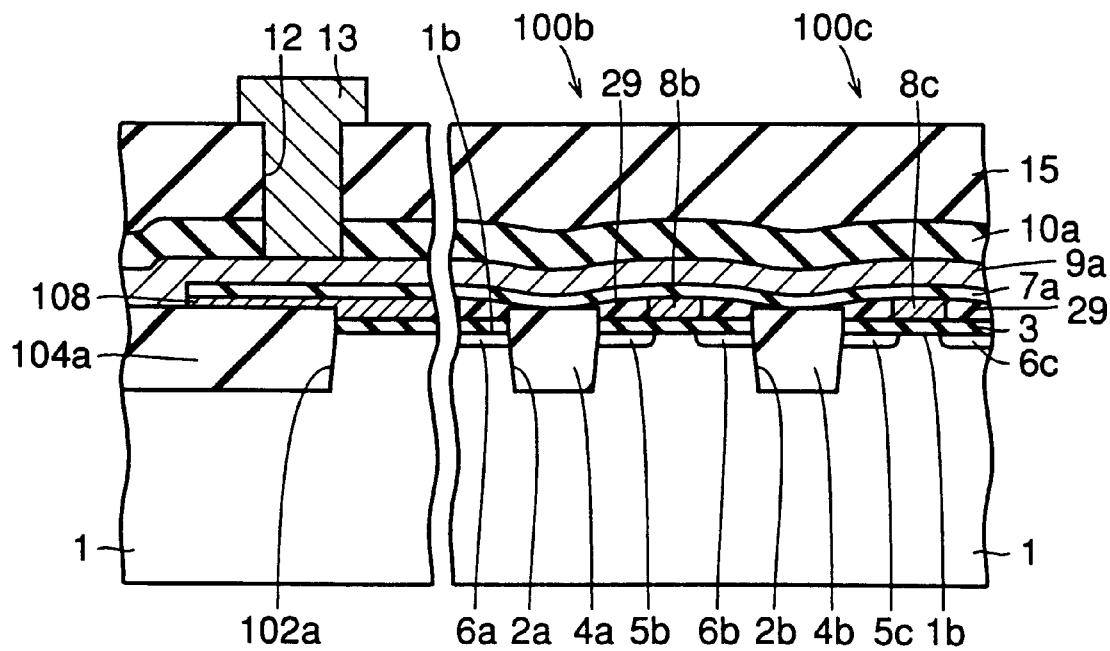
FIG. 2 is a cross sectional view taken along the line II—II (in the direction of word lines) of FIG. 1.
Figure 3:
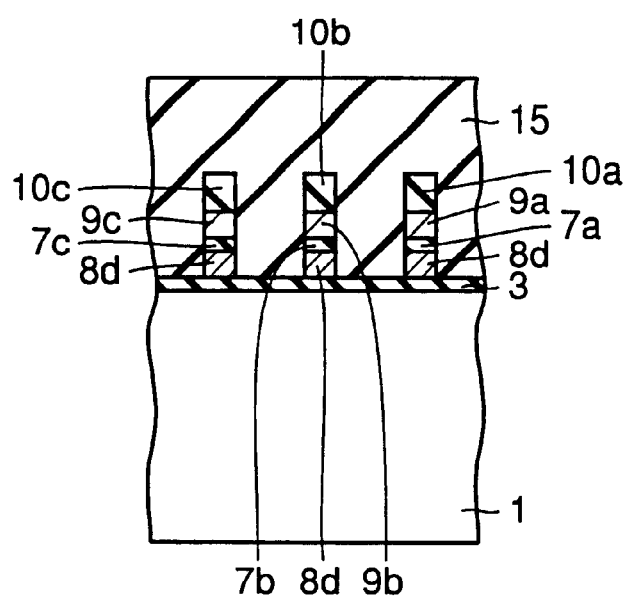
FIG. 3 is a cross sectional view taken along the line III—III (in the direction of data lines) of FIG. 1.

Referring to FIGS. 2 and 3, memory cell transistor 100b consists of a silicon substrate 1 as a semiconductor substrate, source region 5b, drain region 6b, floating gate electrode 8b and control gate electrode 9a.

Memory cell transistor 100c consists of a silicon substrate 1 formed of a silicon single crystal having a diamond type structure, source region 5c, drain region 6c, floating gate electrode 8c and control gate electrode 9a. Therefore, it is the case that memory cell transistors 100b and 100c share control gate electrode 9a. Memory cell transistors 100b and 100c are electrically isolated by isolating oxide film 4b filled in a trench 2b formed in silicon substrate 1.

Trenches 2a, 2b and 102a are formed in main surface 1b of silicon substrate 1. Isolating oxide films 4a, 4b and 104a of a silicon oxide film are formed to fill the trenches.

At the surface of p type silicon substrate 1 doped with an impurity, n type source regions 5b and 5c and drain regions 6a to 6c implanted with arsenic are formed spaced from each other. Regions between the source and drain regions 5b and 6b and between source and drain regions 5c and 6c are the so called channel regions. On the surface of silicon substrate 1, gate oxide film 3 as the first dielectric film is formed. On gate oxide film 3, floating gate electrodes 8b and 8c of doped polysilicon are formed. A conductive layer 108 of the same material as floating gate electrodes 8b and 8c is formed on surface of silicon substrate 1. On both sides of floating gate electrode 8b, silicon oxide film 29 are formed. On floating gate electrodes 8b and 8c, silicon oxide film 29 and conductive layer 108, an ONO film 7a including a stack of an oxide, a nitride and an oxide is formed. On ONO film 7a, control gate electrode 9a is formed to cover ONO film 7a.

Silicon oxide films 10a and 15 are formed to cover control gate electrode 9a. A contact hole 12 is formed in silicon oxide films 15 and 10a. An interconnection layer 13 filling the contact hole reaches control gate electrode 9a.

Referring to FIG. 3, gate oxide film 3 is formed on silicon substrate 1. A plurality of floating gate electrodes 8d are formed on gate oxide film 3. On floating gate electrodes 8d, ONO films 7a, 7b and 7c are formed, respectively. On ONO films 7a, 7b and 7c, control gate electrodes 9a, 9b and 9c are formed, respectively. On control gate electrodes 9a, 9b and 9c, respectively, silicon oxide films 10a, 10b and 10c are formed. To cover these, silicon oxide film 15 is formed.

Figure 4:
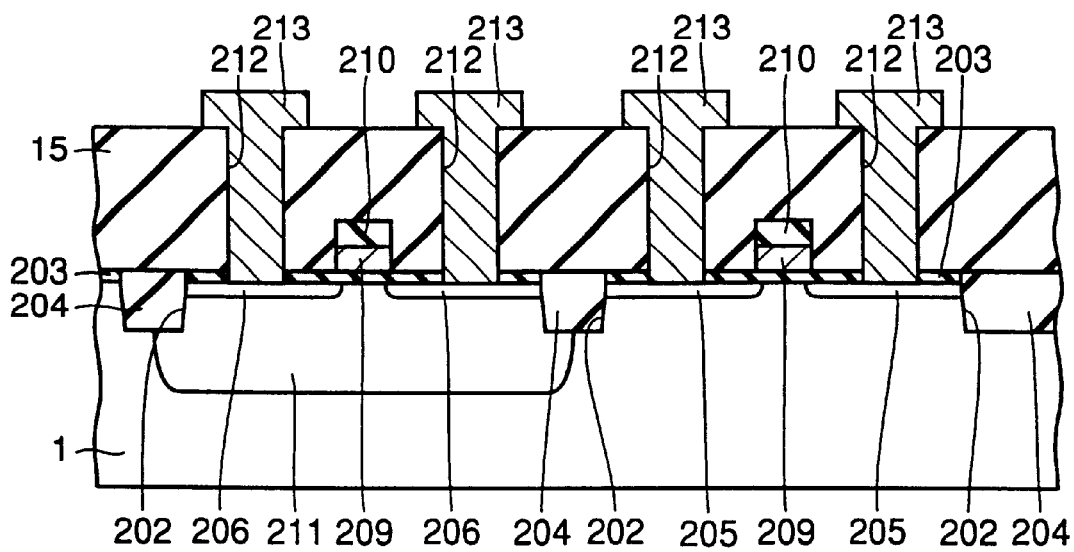
FIG. 4 is cross sectional view showing a peripheral region of the EEPROM shown in FIG. 1.

Referring to FIG. 4, in the surface of silicon substrate 1, trenches 202 are formed, and isolating oxide films 204 are formed to fill trenches 202. In p type silicon substrate 1, n type well region 211 is formed. In n type well region 211, p type impurity regions 206 are formed. Between p type impurity regions 206, gate electrode 209 is formed on silicon substrate 1 with gate oxide film 203 interposed. On gate electrode 209, a silicon oxide film 210 is formed.

In silicon substrate 1, n type impurity regions 205 are formed. Between n type impurity regions 205, gate electrode 209 is formed on silicon substrate 1 with gate oxide film 203 interposed. Silicon oxide film 210 is formed on gate electrode 209.

Silicon oxide film 15 is formed to cover the surface of silicon substrate 1. Contact holes 212 reaching n type impurity regions 205 and p type impurity regions 206 are formed in silicon oxide film 15. Interconnection layers 213 filling contact holes 212 are formed.

In the EEPROM structured as described above, both source and drain regions 5b, 5c, 6b, 6c as well as isolating oxide films 4a and 4b extend in the <100> direction. In the step of heating for forming isolating oxide films 4a and 4b, the isolating oxide films 4a and 4b tend to extend in the direction of longer side. Thereafter, the isolating oxide films 4a and 4b are cooled, and tend to contract in the direction of the longer.

In the step of thermal diffusion for forming source regions 5b and 5c and drain regions 6b and 6c, source regions 5b and 5c and drain regions 6b and 6c tend to extend in the direction of the longer side. Thereafter, the source and drain regions 5b, 5c and 6b and 6c tend to contract in the direction of the longer side. Therefore, stress remains in the silicon substrate 1 in the direction along <100> direction. Even if stress remains in the <100> direction in silicon substrate 1, generation of crystal defects such as dislocation at the surface of the silicon substrate is less likely as compared with the stress remaining in other direction, for example, the cleavage direction of <100>. Therefore, crystal defect hardly generates in the channel region positioned between the source and drain regions. Therefore, even when a voltage (for example, 3.3V) between the high threshold voltage Vthp and the low threshold voltage Vthe is applied to drain region 6b to determine whether data is stored in memory cell transistor 100b, punch through does not occur between the source and drain regions 5b and 6b. Accordingly, when data is stored in memory cell transistor 100b, no current flows between the source and drain regions 5b and 6b, and when information is not stored in memory cell transistor 100b, current flows between the source and drain regions 5b and 6b. Therefore, accurate reading of information is possible.

Further, as there is no crystal defect generated in the channel region, no crystal defect is generated in gate oxide film 3 formed on the channel region, either. As a result, even when electrons are exchanged between silicon substrate 1 and floating gate electrodes 8b and 8c through gate oxide film 3, dielectric breakdown of gate oxide film 3 does not occur. Therefore, even when electrons are injected to or extracted from the floating gate electrodes 8b and 8c many times, insulation of gate oxide film 3 is not damaged, and therefore life of rewriting can be improved. Further, as gate oxide film 3 is not susceptible to dielectric breakdown, charges stored in the floating gate electrodes 8b and 8c do not leak out. Therefore, charge retention characteristic is improved.

Further, when memory cell transistor 100b should be programmed and memory cell transistor 100c should no be programmed, the potential at control gate electrode 9a is set to +20V, and silicon substrate 1 and source and drain regions 5b and 6b are set to the ground potential. Source region 5c is set to the floating state, and a voltage of 7V is applied to drain region 6c. Accordingly, electrons are injected from silicon substrate 1 through silicon oxide film 3 to floating gate electrode 8b. Consequently, the selected memory cell transistor 100b is programmed. The non-selected memory cell transistor 100c has n type drain region 6c, and p type silicon substrate 1. Therefore, the interface between drain region 6c and silicon substrate 1 is biased in the reverse direction. A depletion layer extends from the interface between silicon substrate 1 and drain region 6c to silicon substrate 1. As there is no crystal defect existing in the channel region between source and drain regions 5c and 6c, even when the depletion layer extends to the channel region, electron-hole pairs are not generated in the channel region. Therefore, though a high voltage of 20V is applied to the control gate electrode 9a, electrons are not generated in the channel region, and therefore, electrons are not injected from the channel region through silicon oxide film 3 to floating gate electrode 8c. Therefore, undesirable programming of the non-selected memory cell transistor 100c, that is, the so called drain disturb phenomenon, can be eliminated.

The method of manufacturing the EEPROM shown in FIGS. 1 to 3 will be described in the following.

Figure 5:
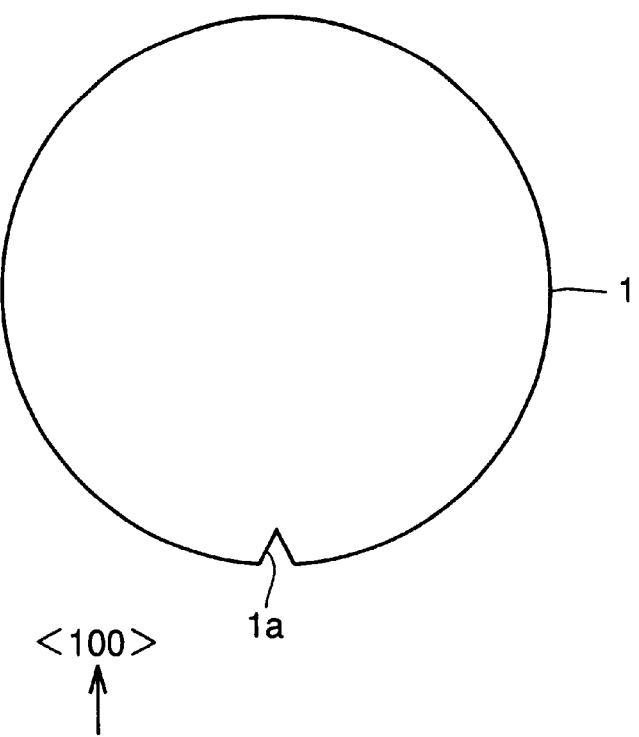
FIG. 5 is a plan view of a silicon substrate used for the description of the first step of manufacturing the EEPROM shown in FIGS. 1 to 3.

Referring to FIGS. 5, a silicon substrate 1 with a notch 1a indicating the <100> direction is prepared.

Figure 6:
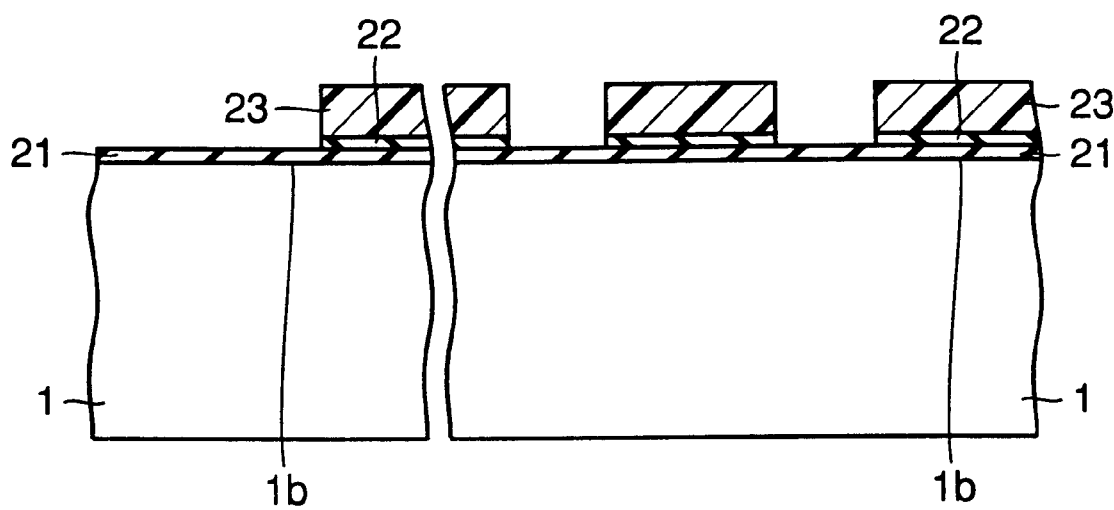
FIGS. 6, 8, 10 and 12 are cross sections taken along the direction of word lines representing the second to fifth steps of manufacturing the EEPROM shown in FIGS. 1 to 3.
Figure 7:
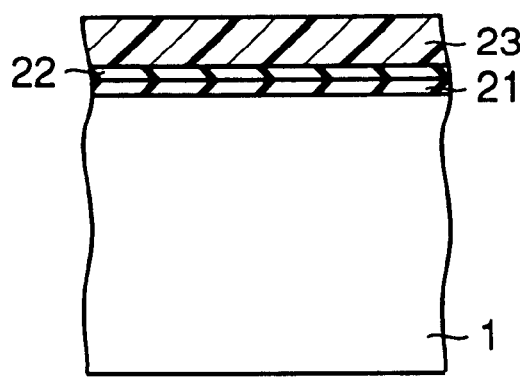
FIGS. 7, 9, 11 and 13 are cross sections taken along the direction of data lines representing the second to fifth steps of manufacturing the EEPROM shown in FIGS. 1 to 3.

Referring to FIGS. 6 and 7, on the main surface 1b of silicon substrate 1, which is (001) plane, a silicon oxide film 21 having the thickness of about 10 nm is formed by thermal oxidation. Thereafter, by reduced pressure CVD (Chemical Vapor Deposition), a silicon nitride from having the thickness of about 200 nm is formed. A resist is applied to silicon nitride film, and the resist is patterned to a prescribed shape by photo lithography, and a resist pattern 23 is formed. By etching the silicon nitride film in accordance with resist pattern 23, silicon nitride film 22 is formed. Here, the cross section shown in FIG. 6 represents a plane vertical to [100] direction.

Figure 8:
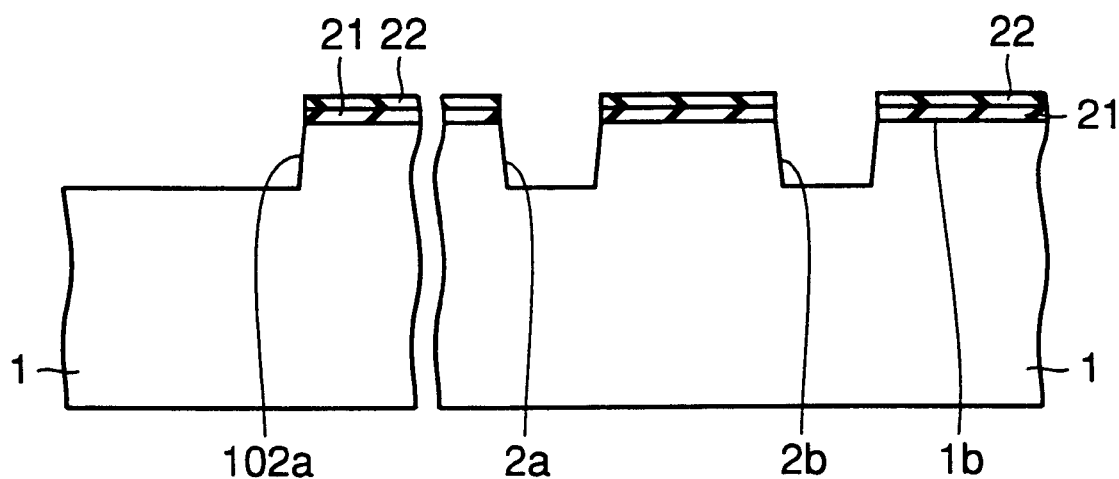
Figure 9:
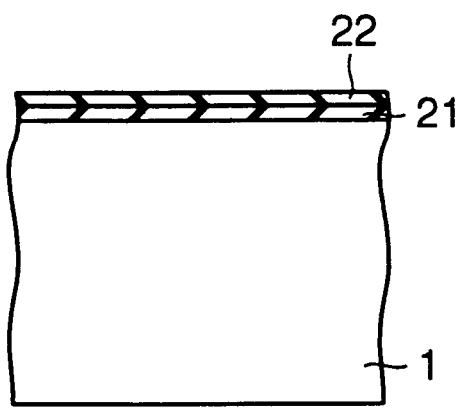

Referring to FIGS. 8 and 9, silicon oxide film 21 and silicon substrate 1 are etched using resist pattern 23 as a mask. Consequently, trenches 2a, 2b and 102a having the depth of about 400 nm are formed in the surface of silicon substrate 1. Thereafter, resist pattern 23 is removed. At this time, trenches 2a, 2b and 102a are formed in such a direction that is aligned with the <100> direction indicated by the notch 1a.

Figure 10:
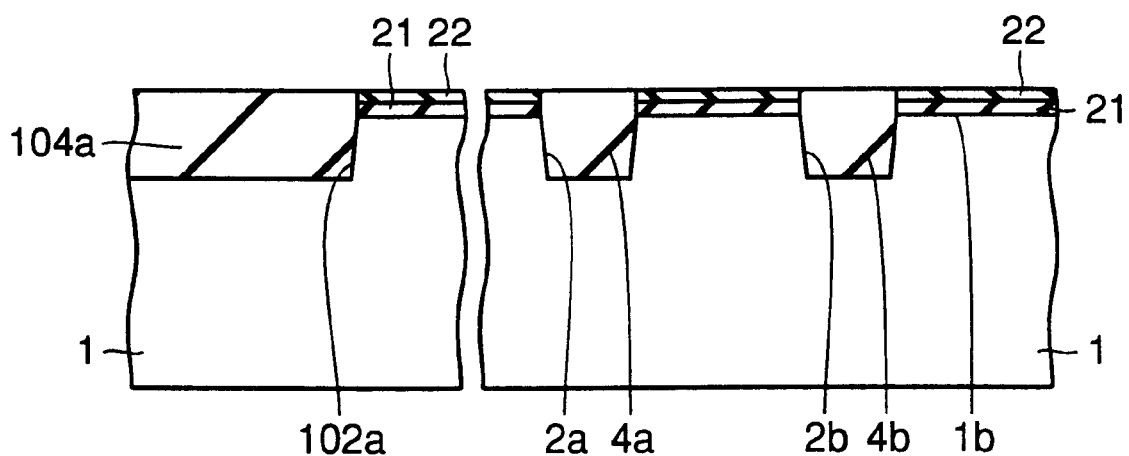
Figure 11:
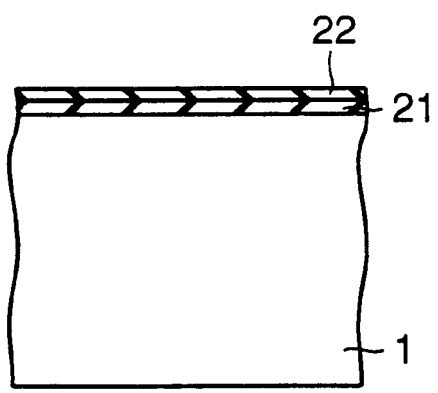

Referring to FIGS. 10 and 11, by the CVD method, a silicon oxide film having the thickness of about 600 nm is formed to fill trenches 2a, 2b and 102a. By CMP (Chemical-Mechanical Polishing) method, the surface of silicon oxide film is polished, the silicon oxide film is etched only by a prescribed amount by using an HF solution, and isolating oxide films 4a, 4b, and 104a filling trenches 2a, 2b and 102a are formed.

Figure 12:
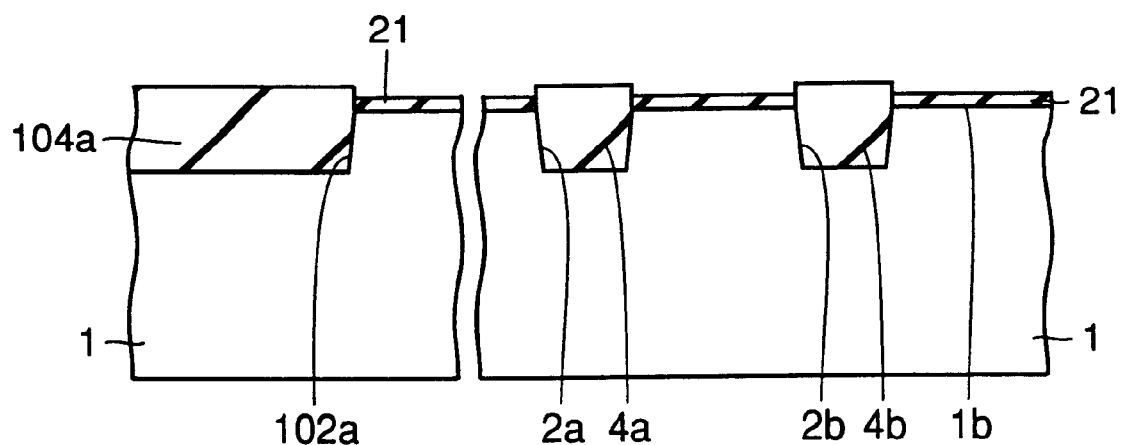
Figure 13:
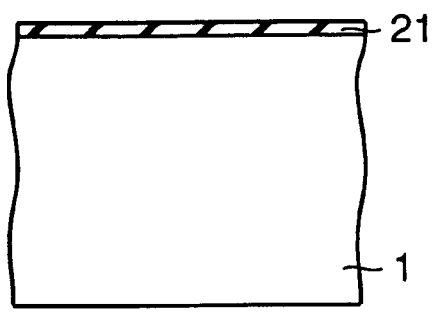

Referring to FIGS. 12 and 13, silicon nitride film 22 is removed by using hot phosphoric acid, and silicon oxide film 21 is removed by the HF solution.

Figure 14:
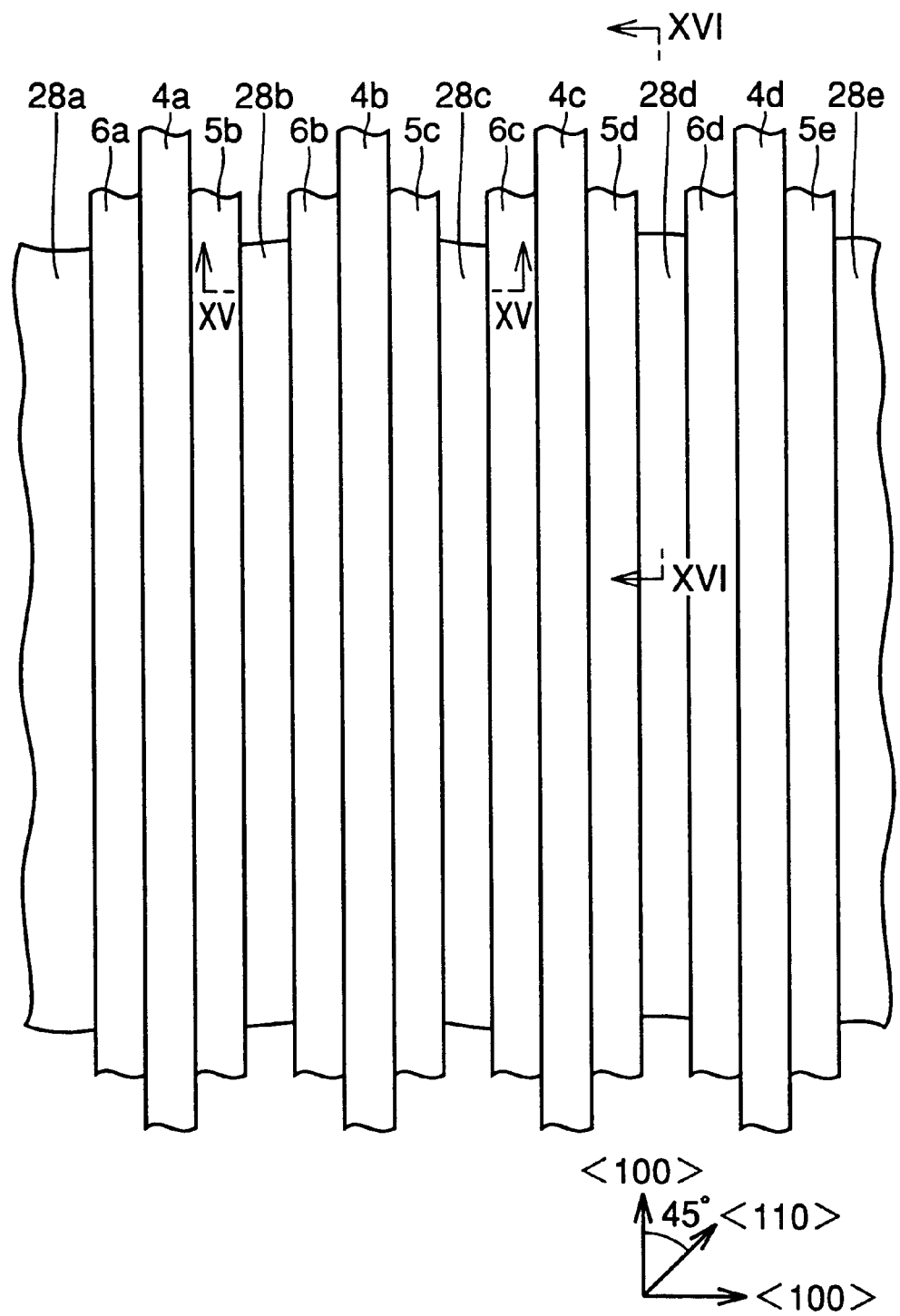
FIG. 14 is a plan view representing the sixth step of manufacturing the EEPROM shown in FIG. 1.
Figure 15:
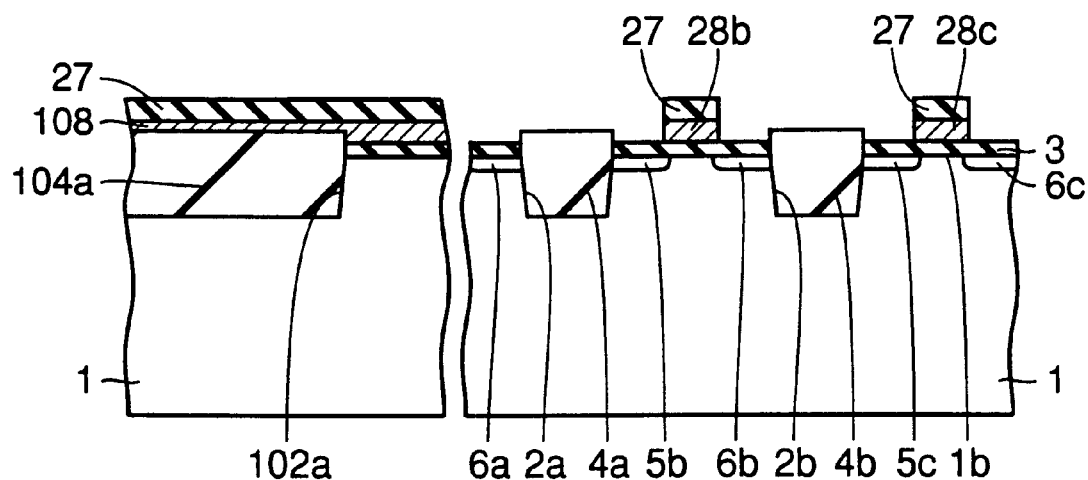
FIG. 15 is a cross section taken along the line XV—XV of FIG. 14.
Figure 16:
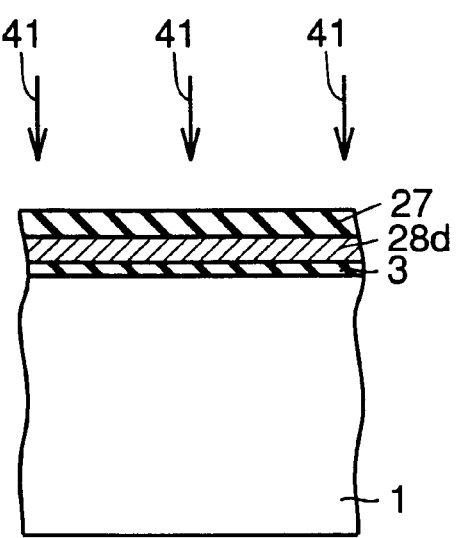
FIG. 16 is a cross section taken along the line XVI—XVI of FIG. 14.

Referring to FIGS. 14 to 16, by thermal oxidation, gate oxide film 3 having the thickness of about 10 nm which will be the gate oxide film (tunneling oxide film) of the memory cell transistors is formed. Thereafter, by the reduced pressure CVD method, doped polysilicon doped with phosphorus having the thickness of 100 nm and a silicon oxide film having the thickness of about 100 nm are deposited. A resist is applied to the silicon oxide film, and the resist is patterned to a prescribed shape by photo lithography to provide a resist pattern (not shown). By etching the silicon oxide film in accordance with the resist pattern, a patterned silicon oxide film 27 is formed. The resist is removed and the doped polysilicon is etched using silicon oxide film 27 as a mask. In this manner, strip shaped conductive layers 28a to 28d for the floating gate electrodes are formed. Using silicon oxide film 27 as a mask, arsenic ions are implanted with the amount of $2 \times 10^{15}/cm^2$ with the implantation energy of 40 keV to silicon substrate 1, in the direction represented by the arrows 41. Thereafter, silicon substrate 1 is heat treated for 30 minutes at a temperature of 850° C. in a nitrogen atmosphere, to form source regions 5b and 5c as well as drain regions 6a, 6b and 5c, which are n diffusion layers. These regions extend approximately along the <100> direction.

Figure 17:
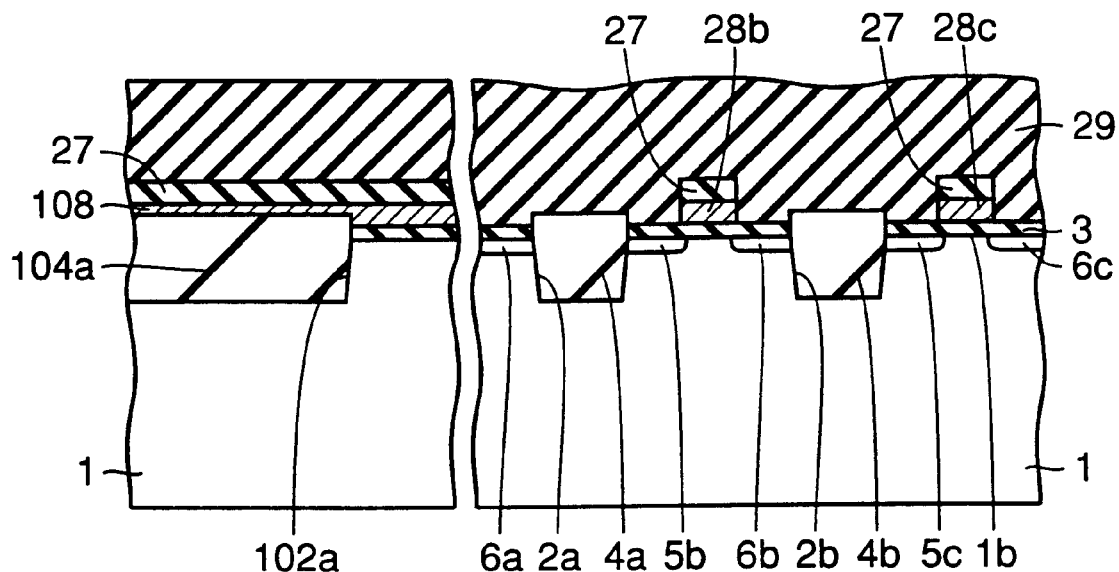
FIGS. 17, 19, 21, 23, 25 and 27 are cross sections taken along the direction of word lines representing the seventh to twelfth steps of manufacturing the EEPROM shown in FIGS. 1 to 3.
Figure 18:
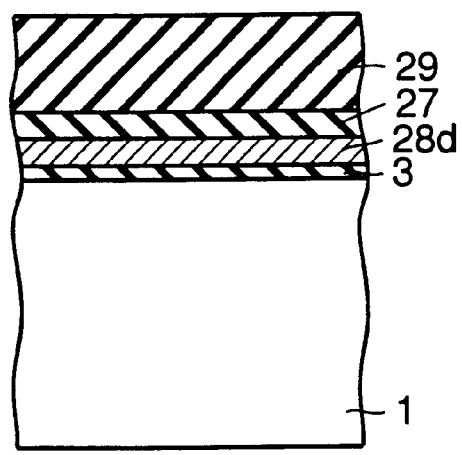
FIGS. 18, 20, 22, 24, 26, and 28 are cross sections taken along the direction of data lines representing the seventh to twelfth steps of manufacturing the EEPROM shown in FIGS. 1 to 3.

Referring to FIGS. 17 and 18, by the reduced pressure CVD, a silicon oxide film 29 having the thickness of about 800 nm is deposited on the main surface 1b of silicon substrate 1. The silicon oxide film 29 is heat treated for 30 minutes at a temperature of 850° C. in a nitrogen atmosphere.

Figure 19:
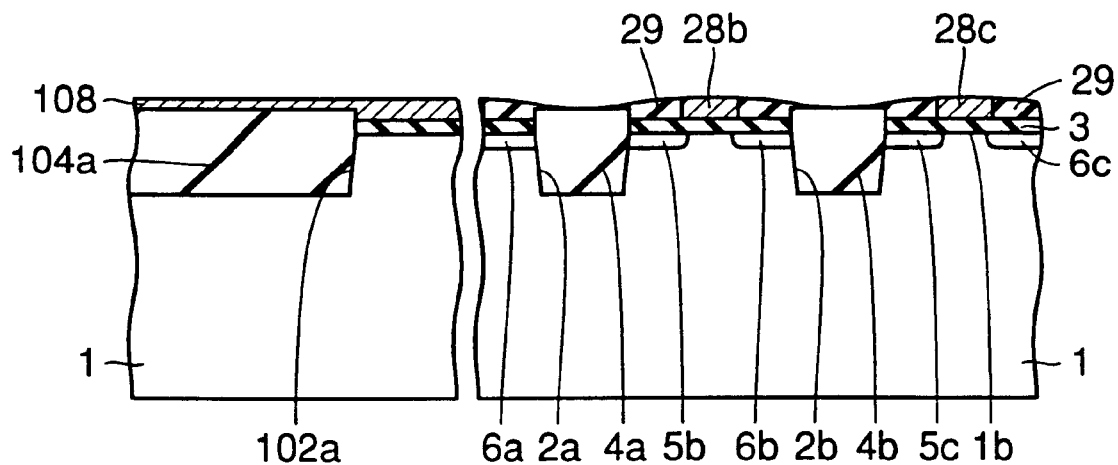
Figure 20:
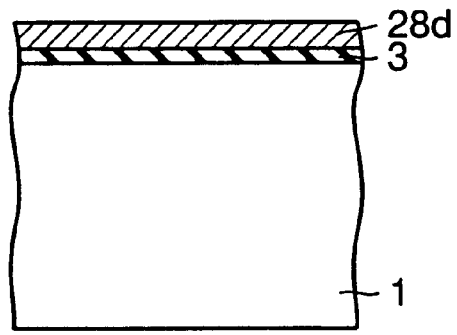

Referring to FIGS. 19 and 20, by etching silicon oxide film 29, surfaces of conductive layers 28b to 28d are exposed.

Figure 21:
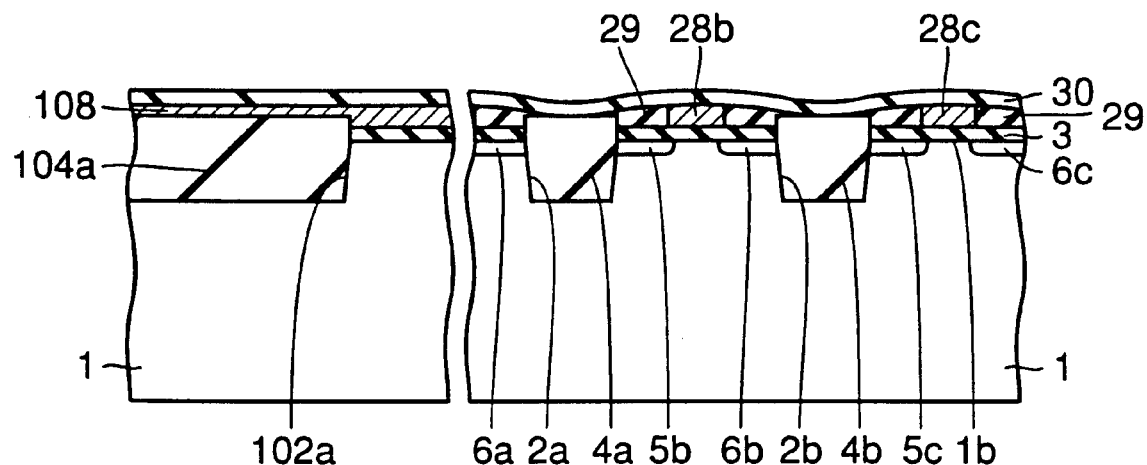
Figure 22:
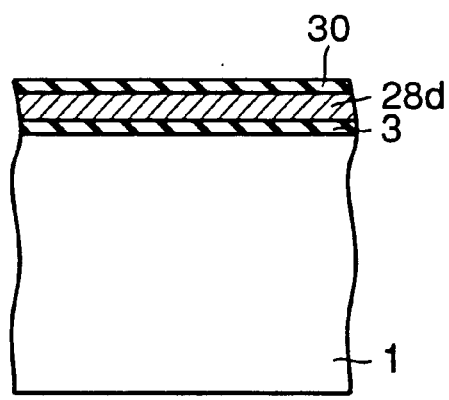

Referring to FIGS. 21 and 22, by the reduced pressure CVD, a three-layered film 30 consisting of a silicon oxide film having the thickness of about 5 nm, a silicon nitride film having the thickness of about 10 nm and a silicon oxide film having the thickness of about 5 nm is formed on conductive layers 28b to 28d.

Figure 23:
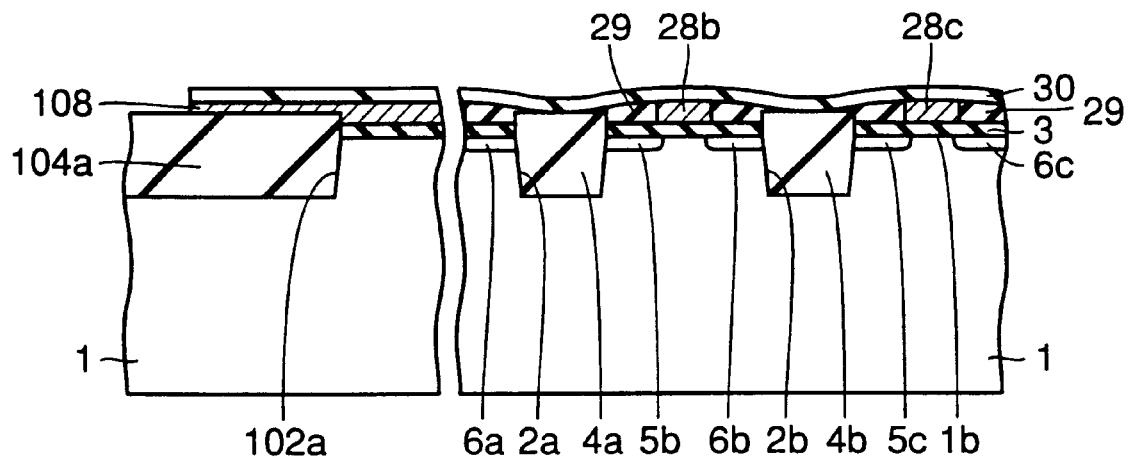
Figure 24:
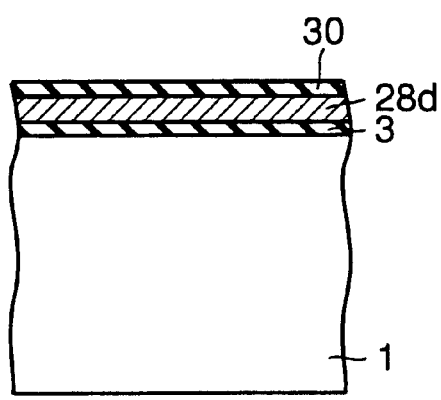

Referring to FIGS. 23 and 24, a resist pattern is formed on a memory cell region, and the three-layered film, the doped polysilicon and the silicon oxide film on the peripheral circuitry are removed. Thereafter, the resist pattern is removed.

Figure 25:
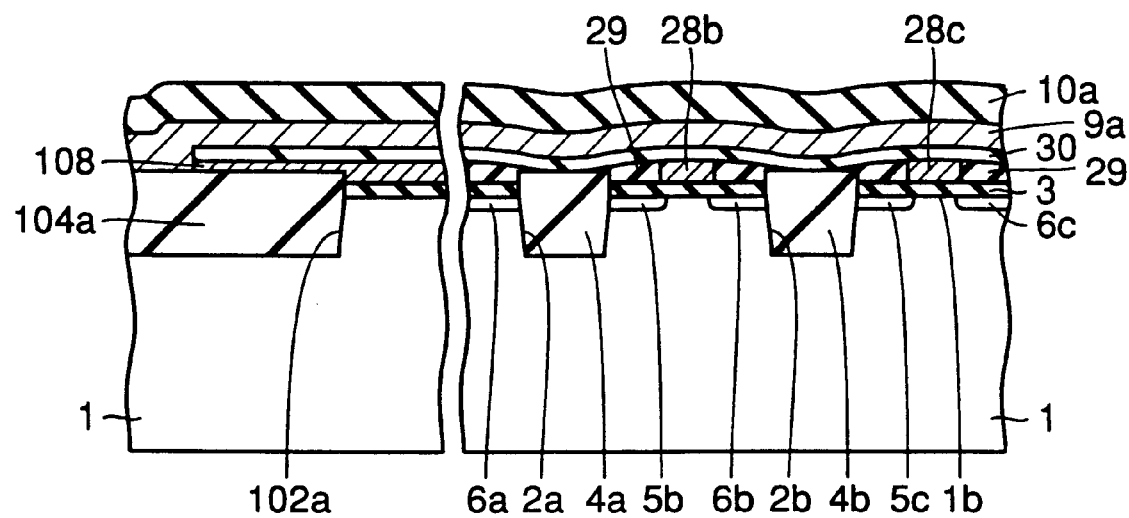
Figure 26:
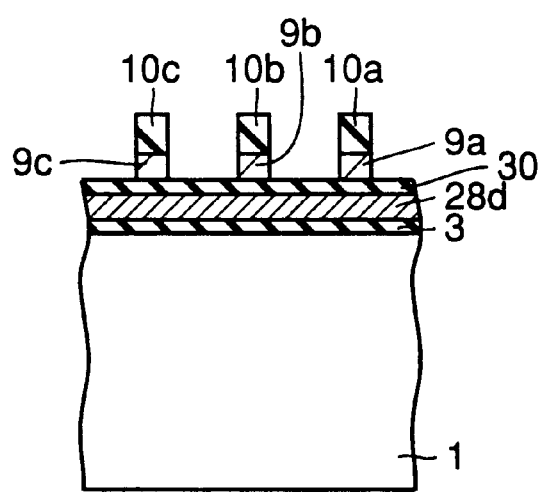

Referring to FIGS. 25 and 26, by the reduced pressure CVD method, the doped polysilicon doped with phosphorus and having the thickness of about 200 nm, and a silicon oxide film having the thickness of about 200 nm are deposited. A resist is applied to the silicon oxide film, and the resist is patterned to a prescribed shape by photo lithography to form a resist pattern. Using the resist pattern as a mask, the silicon oxide film is patterned. In this manner, patterned strip shaped silicon oxide film 10a is formed. Thereafter, the resist is removed and, using silicon oxide film 10a as a mask, the doped polysilicon is patterned. Thus control gate electrodes 9a to 9c of the memory cell transistors are formed.

Figure 27:
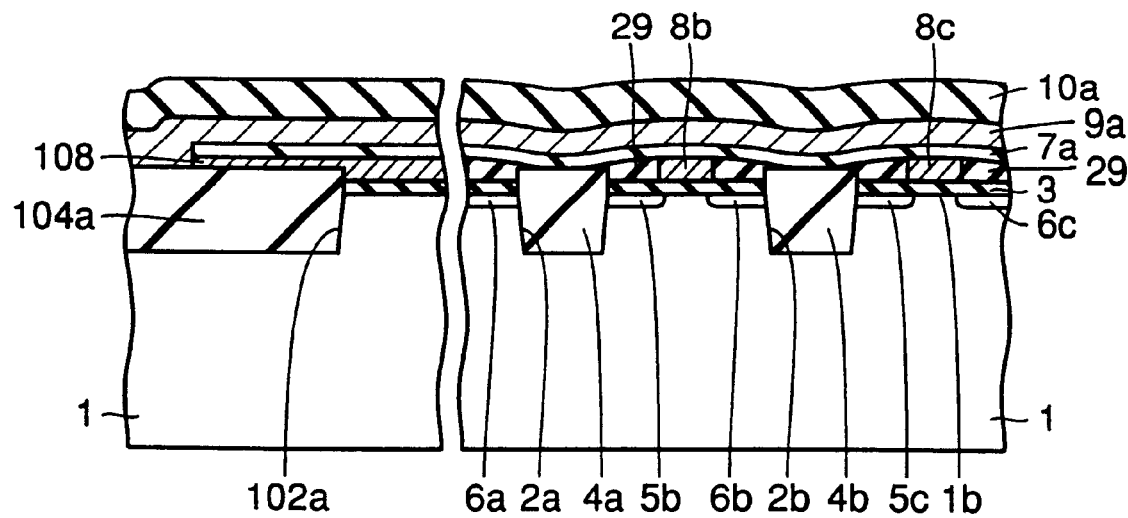
Figure 28:
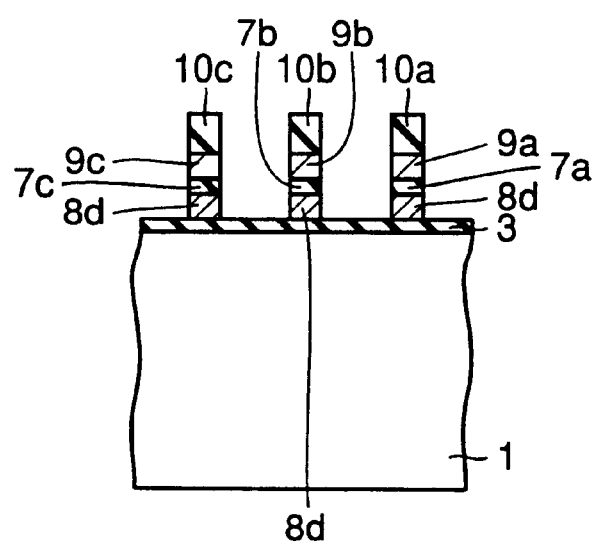
Figure 29:
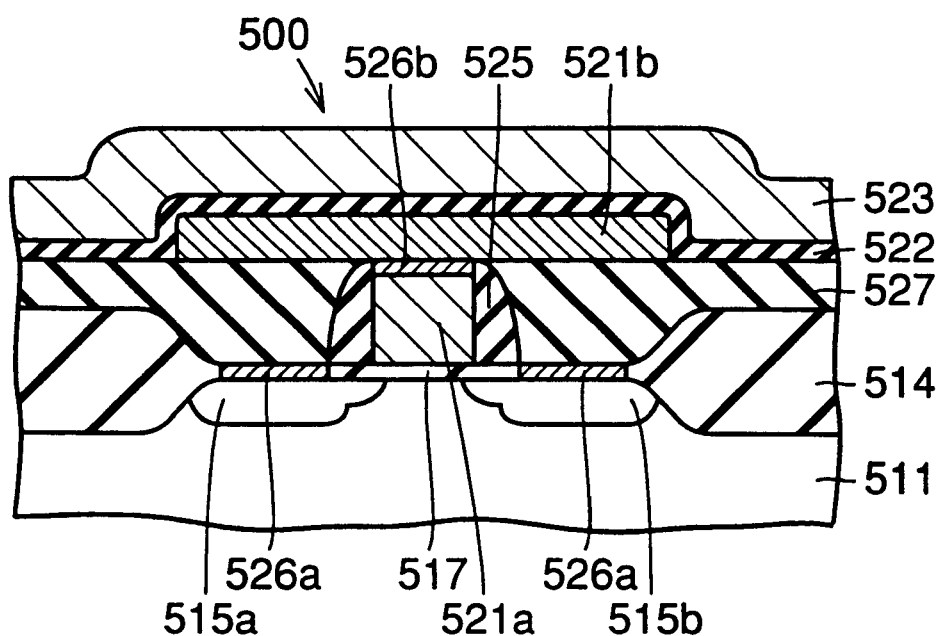
FIG. 29 is a cross section of a conventional EEPROM.

Referring to FIGS. 27 and 28, a resist is formed in the peripheral region by photo lithography, and using the silicon oxide films 10a to 10c in the memory cell portion as a mask, the three-layered film 30 and conductive layer 28 are etched, so that ONO films 7a and 7b and floating gate electrodes 8b to 8d of the memory cell transistors are formed.

Referring to FIGS. 2 and 3, by the CVD method, a silicon oxide film 15 having the thickness of about 1000 nm and doped with boron and phosphorus is formed on silicon substrate 1. The silicon oxide film is baked by heat treatment for 30 minutes at a temperature of 850° C. in a nitrogen atmosphere. On silicon oxide film 15, a resist pattern having a prescribed pattern is formed by photo lithography. By etching silicon oxide film 15 in accordance with the resist pattern, contact holes 12 are formed. By sputtering, an aluminum-silicon-copper (Al—Si—Cu) alloy film is formed. The alloy film fills the contact holes 12. By photo lithography, a resist pattern having a prescribed pattern is formed on the alloy film, and by etching the alloy film using the resist as a mask, an interconnection layer 13 is formed. In this manner, the EEPROM shown in FIGS. 2 and 3 is completed.

According to the manufacturing method described above, the EEPROM shown in FIGS. 2 and 3 which allows accurate reading of information without punch through caused between the source and drain regions, having high endurance for rewriting and superior charge retention characteristic and free of the drain disturb phenomenon can be manufactured.

As can be seen from the step shown in FIG. 5, a silicon substrate 1 is provided with a notch 1a indicating the <100> direction and therefore, the EEPROM can be manufactured by utilizing conventional manufacturing apparatuses.

Various samples were manufactured with the direction of extension of source regions 5b to 5e, drain regions 6a to 6d and isolating oxide films 4a to 4d shifted from <100> direction little by little. It was found that if the angle formed by the direction of extension of source regions 5b to 5e, drain regions 6a to 6d and isolating oxide films 4a to 4d and the direction <100> is smaller than 20°, crystal defects are not generated in the channel region and superior characteristics are exhibited. Further, boron may be diffused in source regions 5b to 5e and drain regions 6a to 6d, and silicon substrate 1 may be of n type.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a semiconductor substrate having a main surface; a plurality of strip shaped isolating insulation films formed on the main surface of said semiconductor substrate to continuously extend approximately along <100> direction;

a plurality of strip shaped impurity regions provided between said plurality of isolating insulation films, formed on the main surface of said semiconductor substrate to continuously extend approximately along the <100> direction, wherein said impurity regions contain boron or arsenic;

a floating gate electrode formed between the plurality of said impurity regions, formed on the main surface of said semiconductor substrate with a first dielectric film interposed, wherein said floating gate electrode includes a plurality of floating gate electrodes formed spaced from each other approximately along the <100> direction; and a control gate electrode formed on said floating gate electrode with a second dielectric film interposed, wherein a plurality of trenches are formed continuously extending approximately along the <100> direction in the main surface of said semiconductor substrate, each of said trenches being filled with each of said isolating insulation films.

2. The non-volatile semiconductor memory device according to claim 1, wherein said control gate electrode includes a plurality of control gate electrodes formed continuously extending along a certain direction, and direction of extension of said isolating insulation films and said impurity regions is approximately orthogonal to the certain direction along which said control gate electrodes extend.

* * * * *